United States Patent [19]

Jefferis

[11] Patent Number: 4,873,494
[45] Date of Patent: Oct. 10, 1989

[54] INDUCTIVE LOOP PRESENCE DETECTOR WITH CROSS TALK FILTER

[75] Inventor: Brian C. Jefferis, Hampshire, United Kingdom

[73] Assignee: Sarasota Automation Limited, Winchester, United Kingdom

[21] Appl. No.: 589,250

[22] Filed: Mar. 13, 1984

[30] Foreign Application Priority Data

Mar. 16, 1983 [GB] United Kingdom ............... 8307280

[51] Int. Cl.$^4$ .............................................. G08G 1/07
[52] U.S. Cl. ...................................... 331/65; 340/941
[58] Field of Search ................... 324/222, 236; 331/25, 331/65, 117 R, 167; 340/552, 933, 941

[56] References Cited

U.S. PATENT DOCUMENTS 4,430,636 2/1984 Bruce ................................... 340/941

OTHER PUBLICATIONS

Linear Integrated Circuit D.A.T.A. Book, Edition 23, D.A.T.A. Inc., San Diego, CA, Jul. 1980, p. 495.

Primary Examiner—Gene Wan
Attorney, Agent, or Firm—Sughrue, Mion, Zinn, Macpeak and Seas

[57] ABSTRACT

An inductive loop presence detector, more especially a vehicle detector, including a loop oscillator having an inductive loop connected as a frequency determining element of the oscillator, which inductive loop may be buried in a roadway to sense the presence of vehicles, and sensing circuitry to detect changes in the loop oscillator frequency due to vehicle movements in the vicinity of the loop, with a filter network inserted between the output of the loop oscillator and the sensing circuitry to improve performance when cross-talk occurs due to mutual interference between a number of inductive loop detectors forming part of a total installation. The filter network can be a phase-locked loop incorporating a low pass filter to attenuate high frequency components due to cross-talk.

2 Claims, 1 Drawing Sheet

INDUCTIVE LOOP PRESENCE DETECTOR WITH CROSS TALK FILTER

BACKGROUND OF THE INVENTION

This invention relates to inductive loop presence detectors, and more particularly inductive loop installations for detecting the presence of vehicles.

When more than one inductive loop vehicle detector is used on a typical installation the detectors can cause mutual interference between one another commonly called "cross talk". The effect is usually brought about by inductive coupling between the loops laid in the roadway although it can be produced by capacitive coupling.

Each road loop is connected to an oscillator and when "cross talk" occurs frequency sidebands are produced in the oscillator whose amplitude and frequency depend upon the frequency separation between the interfering oscillators. This can disturb the sensing circuitry that follows each oscillator and the purpose of which is normally to identify changes in frequency of the loop oscillator caused by vehicle movements.

SUMMARY OF THE INVENTION

According to the present invention there is provided an inductive loop presence detector comprising an inductive loop to sense the presence of an object to be detected, a loop oscillator having the inductive loop connected thereto as an element determining frequency of oscillation, sensing circuitry to detect changes in the loop oscillator frequency due to the movement of an object to be detected in the vicinity of the loop, and a filter network inserted between the loop oscillator output and the input of the sensing circuitry to attenuate "cross talk" due to mutual interference between a plurality of inductive loop detectors.

The filter network is preferably a phase-locked loop.

Apart from dealing with the "cross talk" problem, the filter has the further important advantage that it improves the ability of the detector to reject random noise by reducing the effective bandwidth of the detector.

BRIEF DESCRIPTION OF THE DRAWINGS

Arrangements according to the invention will now be described by way of example with reference to the accompanying drawings, in which.

DETAILED DESCRIPTION OF THE PREFERRED EMBODIMENT

Figure 1:
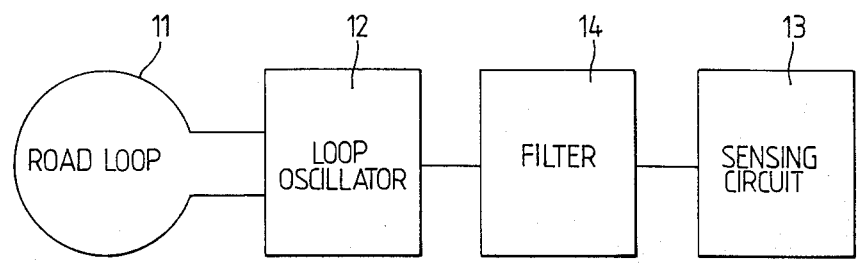
FIG. 1 is a block diagram of a vehicle presence detector embodying the invention.

FIG. 1 shows a vehicle presence detector comprising an inductive loop 11 laid in a roadway, a loop oscillator 12 and a sensing circuit 13 to sense changes in the loop oscillator frequency due to movements of vehicles in the vicinity of the loop. The filter network 14 according to the invention is located between the oscillator 12 and the sensing circuit 13.

Figure 2:
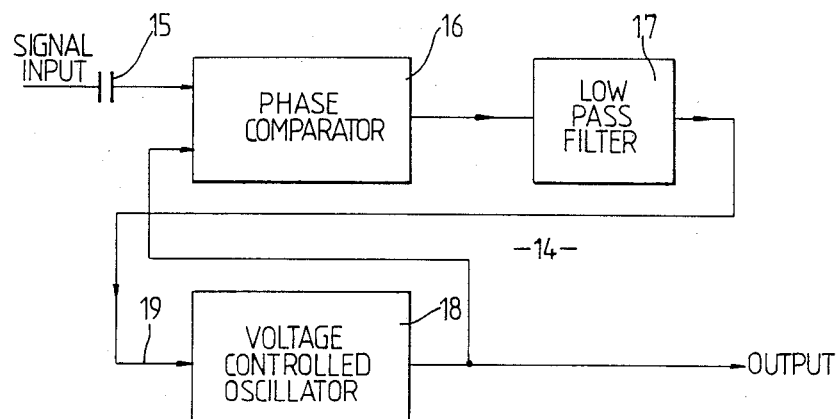
FIG. 2 is a circuit and block diagram of the filter network incorporated in the embodiment of FIG. 1 according to the invention.

FIG. 2 shows the filter network 14 in block diagram form. The output of the loop oscillator 12, including the cross talk frequency sidebands, is applied via a capacitor 15 to one input of a phase comparator 16 which receives on its other input the output of a voltage controlled oscillator 18. The output of the comparator 16 is applied via low pass filter 17 to the frequency control input 19 of the oscillator 18. The voltage controlled oscillator 18 therefore locks to the fundamental frequency of the loop oscillator 12, since the comparator 16 produces a control voltage that regulates the frequency of the oscillator to eliminate any frequency difference at the comparator inputs. The cross talk frequencies produce high frequency components at the comparator output which are attenuated by the low pass filter 17. The output of the filter network 14 is the output of the voltage controlled oscillator 18, which is applied to the input of the sensing circuit 13 of FIG. 1.

Figure 3:
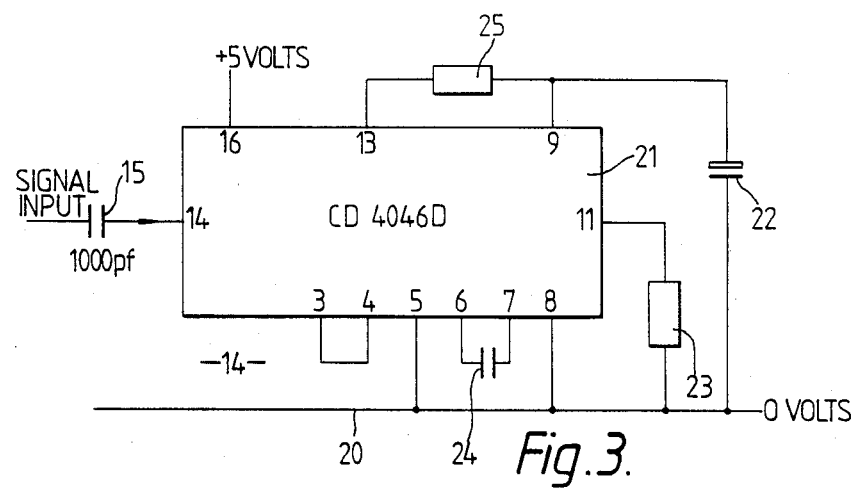
FIG. 3 shows how the filter network of FIG. 2 can be implemented in practice.

FIG. 3 shows how the filter network of FIG. 2 can be implemented using a CD4046D integrated circuit chip 21 manufactured by Signetics. The input signal via capacitor 15 is applied to pin No. 14 and 5 volts is applied to pin No. 16. Pins Nos. 5 and 8 are connected directly to the zero volts line 20, while pins Nos. 9 and 11 are connected to the zero volts line via a capacitor 22 and a resistor 23 respectively. Pins Nos. 3 and 4 are connected directly together, pins Nos. 6 and 7 are connected via a capacitor 24, and pins Nos. 9 and 13 are connected via a resistor 25.

I claim:

1. A system including a plurality of inductive loop presence detectors, each of said presence detectors comprising an inductive loop to (11) sense the presence of an object to be detected, a loop oscillator (12) having said inductive loop connected thereto as an element determining frequency of oscillation, sensing circuity (13) to detect changes in the loop oscillator frequency due to the movement of an object to be detected in the vicinity of said loop, and a filter network (14) inserted between the loop oscillator output and the input of said sensing circuitry, said filter network comprising a phase-locked loop including a filter (17) with a pass band sufficiently low to attenuate beat frequency components due to cross talk caused by mutual interference between said plurality of inductive loop detectors.

2. A system according to claim 1, wherein said phase-locked loop comprises an input capacitor (15) receiving the output of said loop oscillator, a voltage controlled oscillator (18), and a phase comparator (16) receiving the signal from said input capacitor on a first input and the output of said voltage controlled oscillator on a second input, and wherein said filter comprises a low pass filter (17) receiving on its input the output of said phase comparator and delivering its output as a control voltage to a control input of said voltage controlled oscillator, whereby the frequency of said voltage controlled oscillator is locked to that of said loop oscillator, and said low pass filter attenuates cross talk.

* * * * *